(12) United States Patent
Fallica

(10) Patent No.: US 6,835,629 B2
(45) Date of Patent: Dec. 28, 2004

(54) POWER INTEGRATED CIRCUIT WITH VERTICAL CURRENT FLOW AND RELATED MANUFACTURING PROCESS

(75) Inventor: Piero Fallica, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/350,403

(22) Filed: Jan. 23, 2003

(65) Prior Publication Data

US 2003/0134481 A1 Jul. 17, 2003

Related U.S. Application Data

(62) Division of application No. 09/542,092, filed on Apr. 3, 2000, now Pat. No. 6,559,505.

(30) Foreign Application Priority Data

Apr. 6, 1999 (EP) .............................................. 99830196

(51) Int. Cl.[7] ...................... H01L 21/8224; H01L 21/84
(52) U.S. Cl. ...................... 438/336; 438/152; 438/164; 438/311; 438/637
(58) Field of Search ................................ 438/152, 155, 438/164, 311, 336, 637

(56) References Cited

U.S. PATENT DOCUMENTS

| 4,016,596 A | | 4/1977 | Magdo et al. |
|---|---|---|---|
| 4,710,794 A | | 12/1987 | Koshino et al. |
| 4,819,052 A | | 4/1989 | Hutter |
| 5,079,607 A | | 1/1992 | Sakurai |
| 5,223,450 A | | 6/1993 | Fujino et al. |
| 5,432,376 A | | 7/1995 | Zambrano |
| 5,442,222 A | | 8/1995 | Takasu |
| 5,461,253 A | | 10/1995 | Tsuruta et al. |
| 5,547,886 A | | 8/1996 | Harada |
| 5,650,354 A | * | 7/1997 | Himi et al. ................. 438/152 |
| 5,994,188 A | * | 11/1999 | Disney ........................ 438/268 |
| 6,075,268 A | | 6/2000 | Gardner et al. |
| 6,130,458 A | | 10/2000 | Takagi et al. |
| 6,133,610 A | * | 10/2000 | Bolam et al. ................ 257/349 |
| 6,306,691 B1 | | 10/2001 | Koh |
| 6,372,562 B1 | * | 4/2002 | Matsumoto ................. 438/164 |
| 2003/0170936 A1 | * | 9/2003 | Christensen et al. ......... 438/151 |

FOREIGN PATENT DOCUMENTS

| DE | 42 21 039 A1 | 1/1993 |
|---|---|---|
| EP | 0 403 016 A2 | 12/1990 |
| JP | 4-113679 | 4/1992 |

OTHER PUBLICATIONS

European Search Report form European Priority Application No. 99830196, filed Apr. 6, 1999.
A. Nkagawa, N. Yasuhara and Y. Baba, *New 500V Device Structures for Thin Silicon Layer on Silicon Dioxide Film*, Procedings of 1990 International Symposium on Power Semiconductor Devices & ICS, 1990 pp. 97–101, XP002115551.

* cited by examiner

*Primary Examiner*—George Eckert
(74) *Attorney, Agent, or Firm*—Lisa K. Jorgenson; James H. Morris; Wolf, Greenfield & Sacks, P.C.

(57) ABSTRACT

Integrated circuit including a power component with vertical current flow and at least one low or medium voltage component, the at least one low or medium voltage component formed in a first semiconductor layer separated from a second semiconductor layer by an insulating material layer. The power component with vertical current flow is formed in the second semiconductor layer, and excavations are formed in the insulating material layer which extend from a free surface of the first semiconductor layer to the second semiconductor layer, said excavations having lateral walls of insulating material and being filled up with a conductor material in order to electrically contact active regions of the power component in the second semiconductor layer by electrodes placed on the free surface of the first semiconductor layer.

22 Claims, 10 Drawing Sheets

POWER INTEGRATED CIRCUIT WITH VERTICAL CURRENT FLOW AND RELATED MANUFACTURING PROCESS

CROSS REFERENCE TO RELATED APPLICATIONS

This application is a division of prior application Ser. No. 09/542,092, filed on Apr. 3, 2000 now U.S. Pat. No. 6,559,505, entitled Power Integrated Circuit with Vertical Current Flow and Related Manufacturing Process, now allowed.

BACKGROUND OF THE INVENTION

1. Field of the Invention

The present invention relates to a high voltage semiconductor device and related manufacturing process. More particularly the invention relates to a power integrated device with vertical current flow.

2. Discussion of the Related Art

A very common problem in power integrated devices lies in the existence of parasitic effects due to the undesired interaction among the elements of the integrated circuit and the power transistor. In fact these devices are integrated on the same silicon substrate and are insulated from each other by junctions polarized in reverse-bias. Therefore the formation of parasitic components is inevitable with the realization of the power device. A parasitic component can induce, above all during its switching on/off, some large disturbances on the circuit components connected thereto. The disturbances increase as the switching speed increases and as the voltage or current that the power device operates with increases. These disturbances are more considerable in the case of power integrated devices with vertical current flow.

The state of the art provides for the utilization of several technologies for the reduction or the elimination, where it is possible, of the parasitic components which are present in the power integrated device. These technologies provide for a substantial change in the structure of the power integrated circuits by introducing a dielectric layer, most often an oxide layer, to insulate the components.

For the insulation of the components of the power integrated devices with lateral current flow, several technologies are known, such as LOCOS and trench, and a technology providing for the utilization of buried oxide, otherwise called SOI. That technology is moreover used for the insulation of the power integrated devices with vertical current flow. The "SOI" technology however lends itself to different methods of implementation.

One of the methods more used is the so-called "dielectric isolation". This method, used for power integrated devices with lateral current flow, requires supplementary manufacturing process steps. Starting with a silicon substrate, trenches are realized with oblique walls, by a selective etching of the silicon. Then the silicon surface is oxidized and a thick layer of polysilicon is deposited thereon. Then the silicon layer of the starting substrate is mechanically removed in order to arrive at the bottom of the trenches previously excavated. At the end silicon isles are obtained, totally enclosed by oxide, where it is possible to make the circuit components. The silicon layer serves only as a mechanical support and, in order to avoid to deposit very thick polysilicon layers, it is possible, as a variant of this method, to solder the silicon wafer thus obtained with another silicon substrate which, together with the polysilicon layer, serves as a mechanical support.

Another realization method of the "SOI" technology is "SDB" (Silicon Direct Bonding). This method, used for a power integrated device with lateral current flow, consists in the use of two silicon wafers that are firstly oxidized and then soldered. One of the two silicon wafers is thinned and polished. The other silicon wafer, of a given thickness, serves as a mechanical support. Therefore a single silicon wafer is obtained made up of a thin silicon layer superimposed on an oxide layer of given thickness, deriving from the union of the oxide layers of the two starting wafers, which is superimposed on a silicon layer of a given thickness. The circuit's components will be realized in the thinned silicon layer. The realization of the lateral insulation of the integrated device is obtained by providing trenches in the silicon, which are deep to arrive to the buried oxide layer, and are filled up with suitable dielectrics, for example thermal oxide with a silicon nitride.

The "SDB" method, described before, can also be used for the realization of power integrated circuits with vertical current flow. After the soldering of the two silicon wafers is executed, and one of the two wafers is reduced to the desired thickness, a photolithography is executed in order to remove the silicon and the deposited oxide, in some regions of the device. The epitaxial growth of the doped silicon is executed and the doped silicon layer is planarized. So some "isles" of buried oxide are obtained wherein the low voltage components of the integrated device are obtained, such as those of signal or control, while the power component is made in the regions wherein the oxide is absent. The lateral insulation of the device is executed by realizing trenches in the silicon, deep enough to arrive at the buried oxide layer, and filled up with suitable dielectrics, for example thermal oxide with nitride.

A variant to the method above described for the realization of the power device with vertical current flow, provides, differently from the method above described, for the realization of the oxide isles, by photolithographic process, before of the soldering of the two wafers.

Another method used for the realization of the power device with vertical current flow, is "SIMOX" (Separation by IMplanted OXygen). This method consists in implanting oxygen ions with very high doses (1017–1018 ions/cm2) into the doped silicon wafer through a suitable photolithography mask. The implanted oxygen layer, after opportune thermal processes, reacts with the silicon forming silicon oxide in the region previously implanted. If the implant energy is adequately high, over the layer of silicon oxide a thin crystalline silicon layer remains, sufficient in order to realize the low voltage components, while in the region of the device wherein the silicon oxide is not present, the power component with vertical current flow can be realized.

However the methods before described for the realization of the power devices, have notable disadvantages. In fact the "dielectric isolation" method, due to the presence of the oblique walls, does not allow the reduction of the components' sizes beyond some point. The "SDB" method, used for the realization of the power integrated circuits with vertical current flow, presents a notable complexity of realization. The process of wafer soldering, the epitaxial growth of the doped silicon and the successive implanting are very expensive processes. Also the epitaxial growth of the doped silicon in the region wherein the oxide layer is faced laterally to the surface, will produce defective silicon zones. The variant to the "SDB" method for the realization of the power device with vertical current flow, above described, presents a practical difficulty. In fact the soldering of the wafers whose surface is not uniform, in particular surfaces which present silicon zones alternated to silicon oxide zones, is more problematic and gives a lower yield. The "SIMOX"

method for the realization of the power device with vertical current flow, is very expensive for the very high doses of the oxygen implant. The silicon layer over the oxide presents a number of defects which are particularly deleterious for the realization of the bipolar components. It is also possible that in the outline region of the buried oxide isle, defects are originated which propagate in the surrounding silicon, for the different coefficient of thermal expansion of the two materials.

SUMMARY OF THE INVENTION

In view of the state of the art described, it is an object of the present invention to provide a power integrated device with vertical current flow wherein the disturbances produced by switching of the power transistor are substantially reduced, and representing a more effective, simpler and less expensive solution than the present power devices.

According to the present invention, this and other objects are attained by an integrated circuit comprising a power component with vertical current flow and at least one low or medium voltage component, the at least one low or medium voltage component formed in a first semiconductor layer separated from a second semiconductor layer by an insulating material layer, wherein said power component with vertical current flow is formed in the second semiconductor layer, and excavations are formed in the insulating material layer which extend from a free surface of the first semiconductor layer to the second semiconductor layer, said excavations having lateral walls of insulating material and being filled up with a conductor material in order to electrically contact active regions of the power component in the second semiconductor layer by electrodes placed on the free surface of the first semiconductor layer.

As a result of the present invention it is possible to realize a power integrated device with vertical current flow wherein the disturbances produced by the switching of the power transistor are significantly reduced, allowing a three-dimensional integration of the device, not requiring an elimination of the buried insulated material layer for the manufacturing of the high voltage component, simpler to fabricate than the described manufacturing methods, not needing additional process steps such as an epitaxial growth of the silicon layer or the planarization of the silicon wafer, lowering manufacturing costs of the device, allowing a notable reduction of the sizes of the device.

BRIEF DESCRIPTION OF THE DRAWINGS

The features and the advantages of the present invention will be made evident by the following detailed description of some particular embodiments, illustrated as not limiting examples in the annexed drawings, wherein.

DETAILED DESCRIPTION

Figure 1:
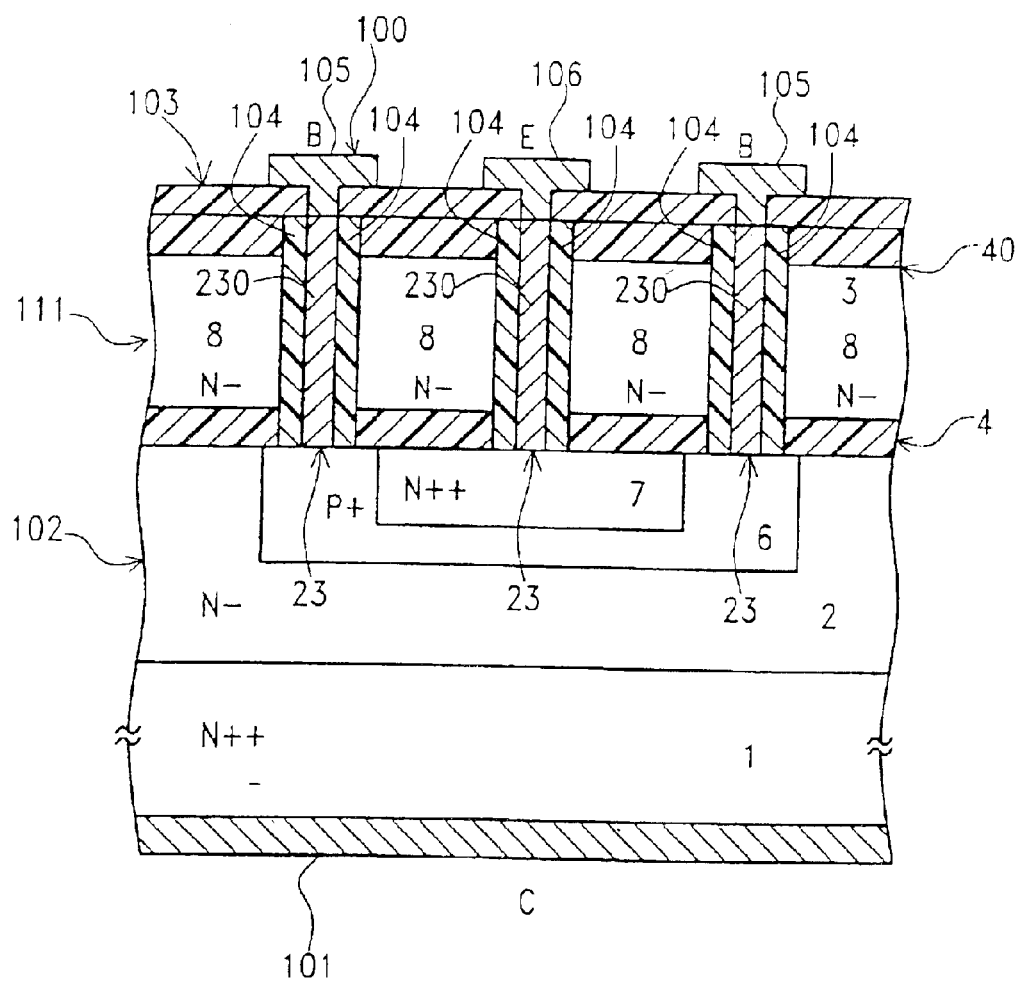
FIG. 1 is a cross-sectional schematic view of an integrated circuit according to a first embodiment of the present invention.

With reference to the annexed drawings, and specifically to FIG. 1, an integrated circuit 40 according to the present invention in cross-section is shown, comprising a power component, for example a bipolar NPN transistor with vertical current flow 100. This integrated circuit 40 comprises a semiconductor layer 1 with high concentration of N type dopant, for example antimony or arsenic. Such silicon layer 1 is connected at its bottom surface to a metal electrode 101, formed by one or more metal layers, which represent the collector contact of the power component 100. Over the top surface of layer 1 a silicon layer 2 is placed, with a low concentration of N type dopant. Such layer 2 is generally formed on the layer 1 by an epitaxial growth. The thickness of the layer 2 is defined by the designer in according to the voltage which must be withstood by the power component 100. The layer 2 represents the collector of the component 100. In the middle of layer 2, a silicon region 6 with P type dopant is present. Such region 6 represents the base of the power component 100, and contains a silicon region 7 with high concentration of N type dopant. Such region 7 represents the emitter of the power component 100. On the surface of the layer 102, composed by silicon layers 1 and 2, a buried insulating material layer 4 is placed, for example oxide, not continuos, but presenting a hole succession. On the top surface of such insulating layer 4, a silicon layer 111 is placed with low concentration of N type dopant. The top surface of the layer 111 is covered by a silicon oxide layer 103. In the silicon oxide layer 103, in the silicon layer 111 and in the buried insulating material layer 4, excavations 23 are formed whose vertical walls are covered by a dielectric material 104, for example thermal oxide or deposited oxide or silicon nitride. Such excavations 23 are filled up with a conductor material 230, for example metal or doped polysilicon. Such excavations 23 delimit silicon regions 8, with low concentration of N type dopant, enclosed at their top by the silicon oxide layer 103, and laterally by the dielectric walls 104 and at their bottom by the buried insulated material layer 4. Such regions 8 are adapted to contain low or medium voltage components of the power integrated device 40. Excavations 23 are formed in correspondence of the regions 6 and 7, and, as a result of the conductor material that fills them up, they allow to contact superficially the base and the emitter of the power component 100, with opportune metal electrodes 105, 106 that, with the electrode 101, represent external contacts of the power component 100. Low and medium voltage components are realized in the regions 8 placed over the base 6 and the emitter 7 of the power transistor 100, are surrounded totally by dielectric material and then they are totally insulated from each other and from the power component 100. However, being these regions 6 and 7 at low potential, disturbances due to the switching on/off of the power transistor 100, have minor weight than in the traditional technologies for the power integrated device with vertical current flow.

Figure 1A:
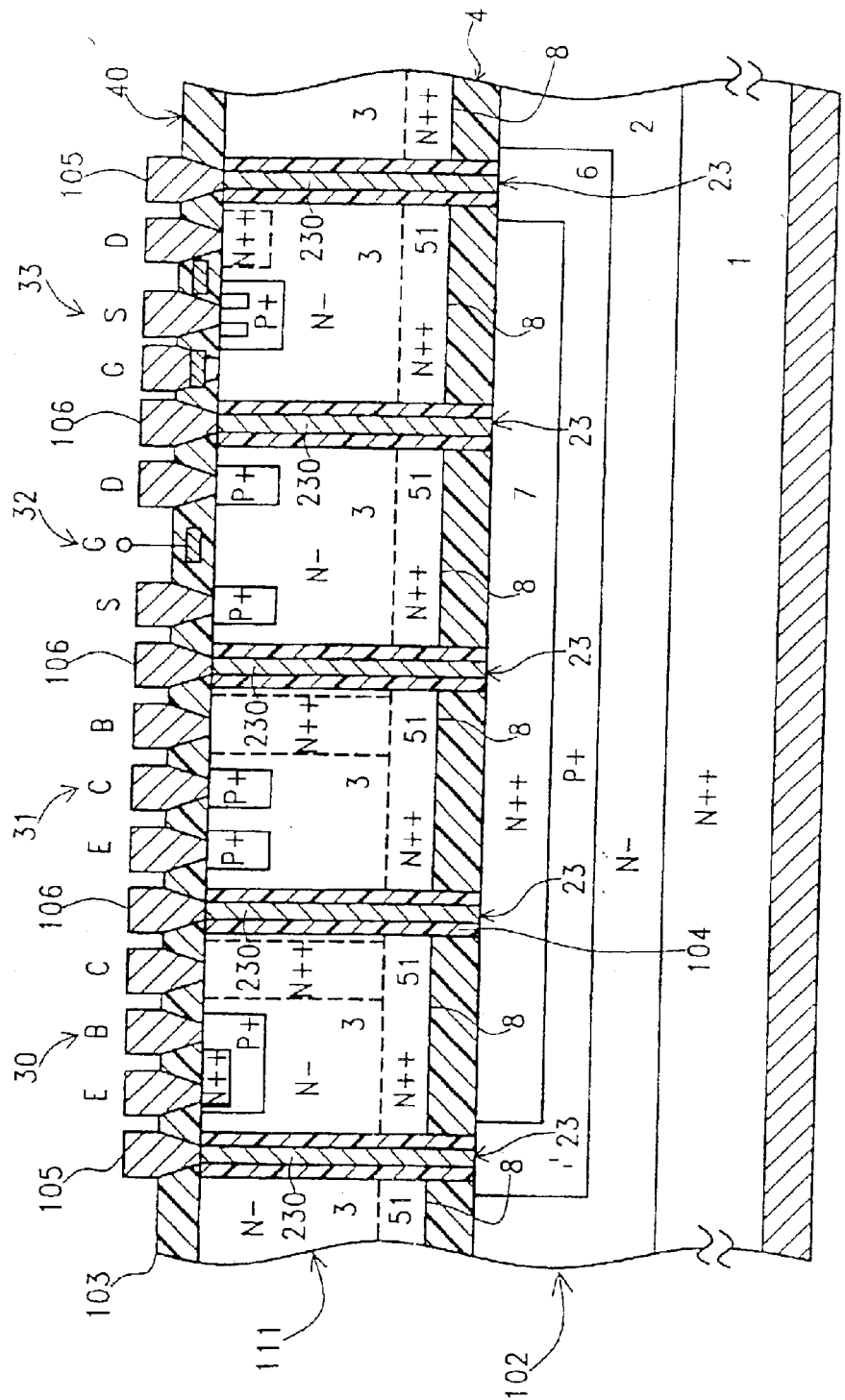
FIG. 1a is similar to FIG. 1, but is a more detailed view.

As shown in FIG. 1a, the silicon layer 111 can be made up by two superimposed silicon layers with a different concentration of N type dopant, a bottom layer 51 with a high dopant concentration, and a top layer 3 with low concentration. This is for example useful if low voltage components are to be formed, such as NPN transistors with vertical current flow, as shown for example in FIG. 1a where the low and medium voltage components are a vertical NPN bipolar transistor 30, a lateral PNP bipolar transistor 31, a P-channel MOS transistor 32, a lateral DMOS 33. These components are completely insulated from each other and from the power component 100 by insulating material layers.

The layer 4 of the device 40 can be formed not only by a single insulating material layer, but by a succession of dielectric layers, for example thermal oxide and deposited oxide, or thermal oxide and silicon nitride.

With reference to FIGS. 2–11, the main steps of the process for the manufacturing of the integrated device 40 are shown therein.

Figure 2:
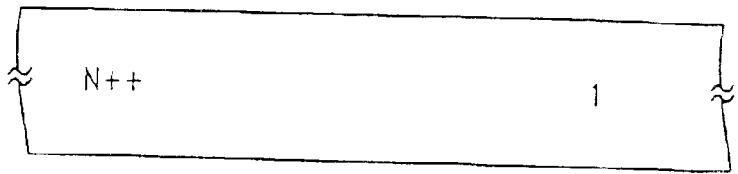
FIGS. 2 to 11 are cross-sectional views as those of FIG. 1, showing the main steps of a manufacturing process according to a first embodiment of the present invention.
Figure 3:
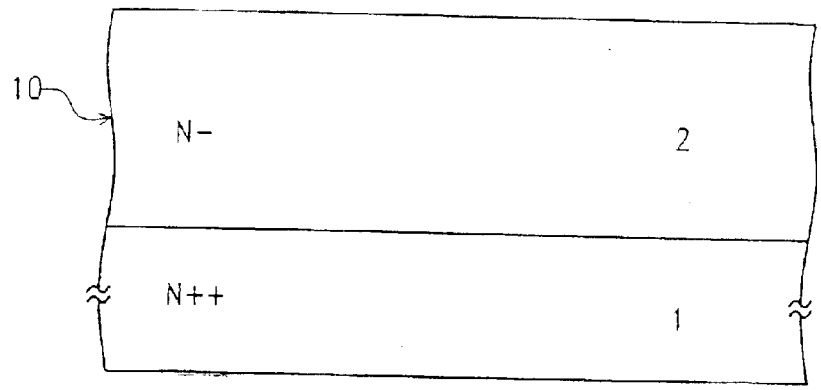
Figure 4:
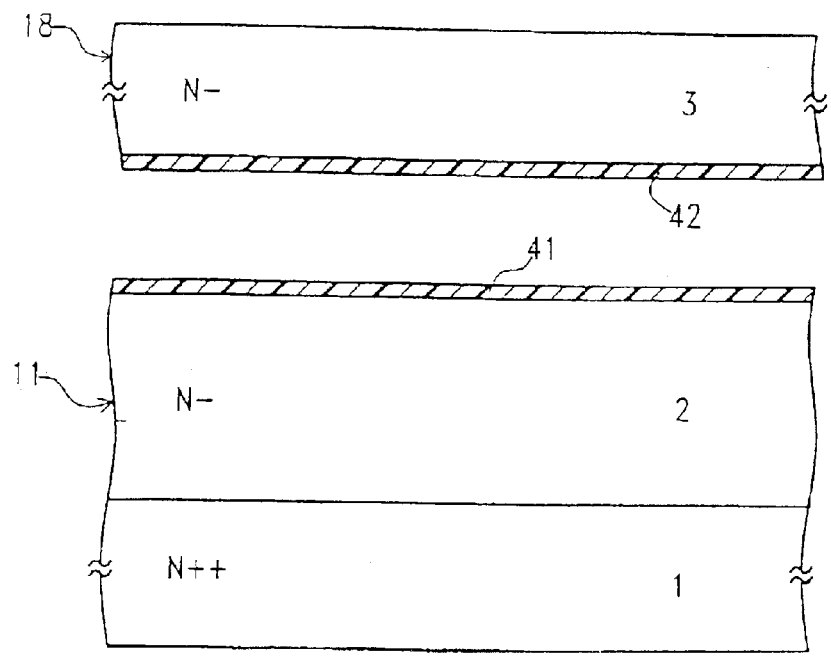
Figure 5:
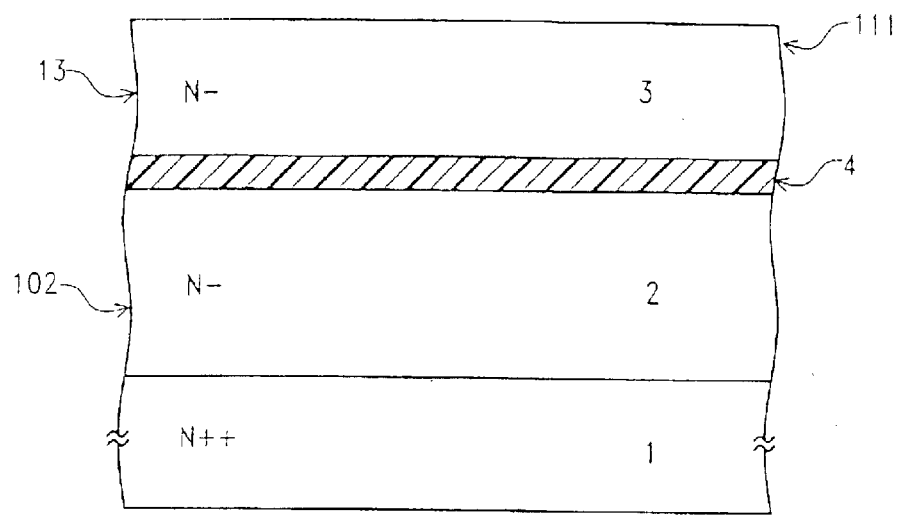
Figure 6:
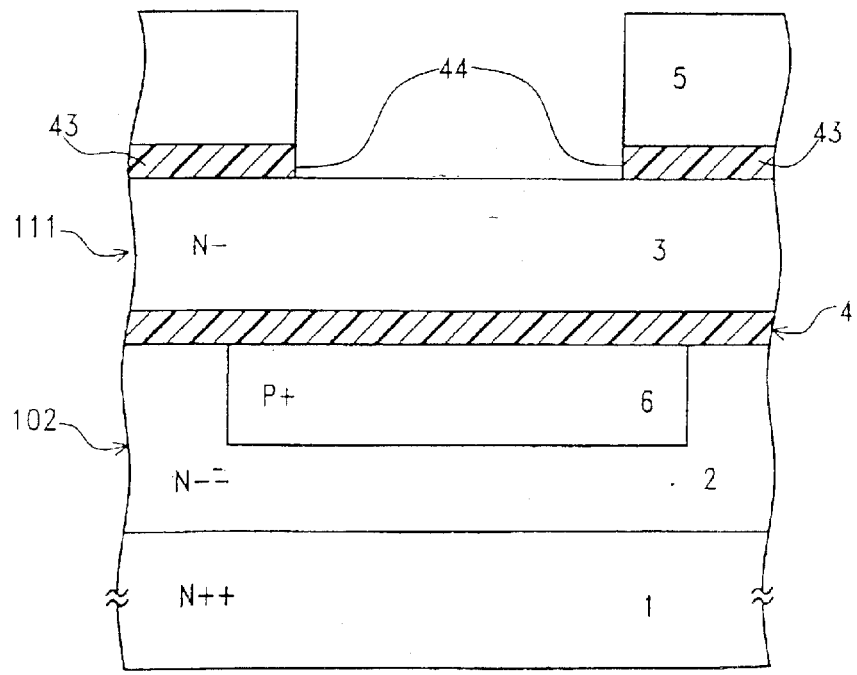
Figure 7:
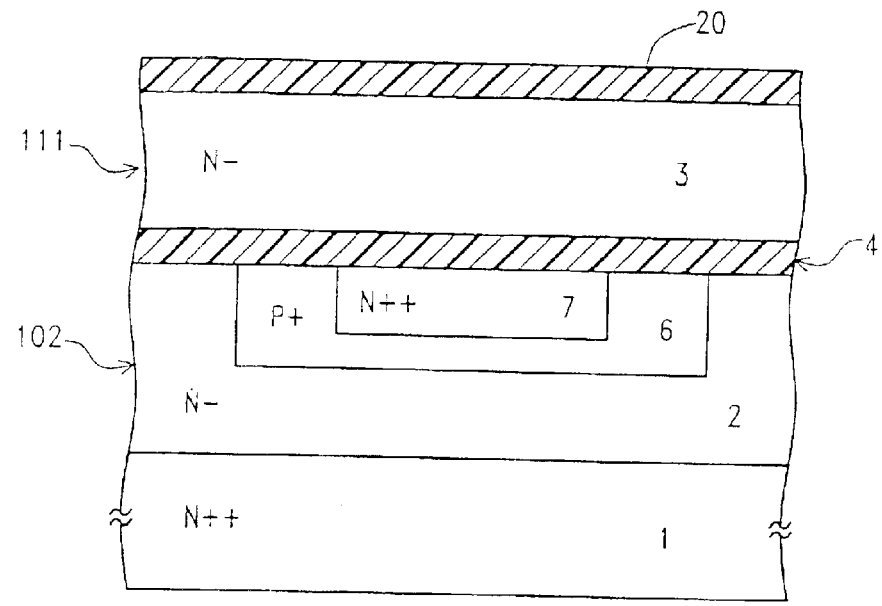
Figure 8:
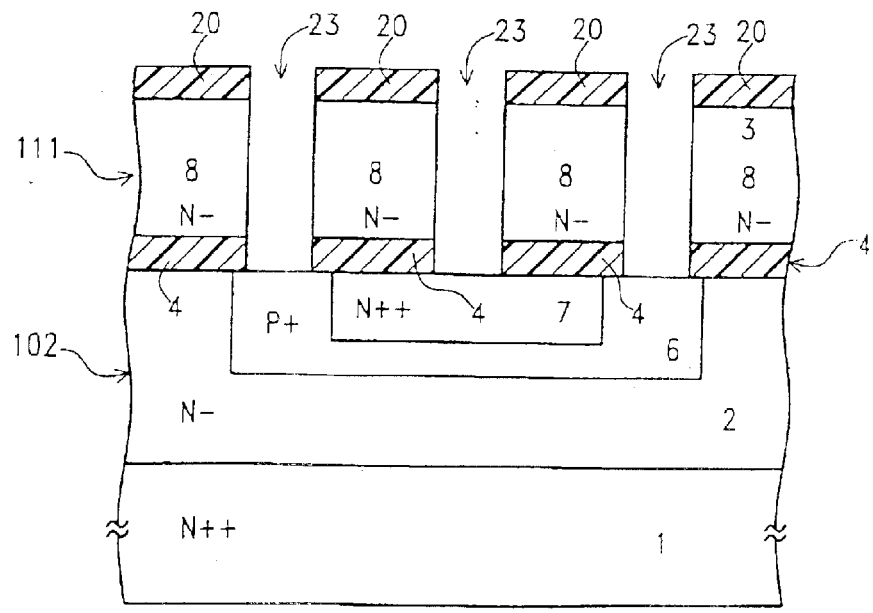
Figure 9:
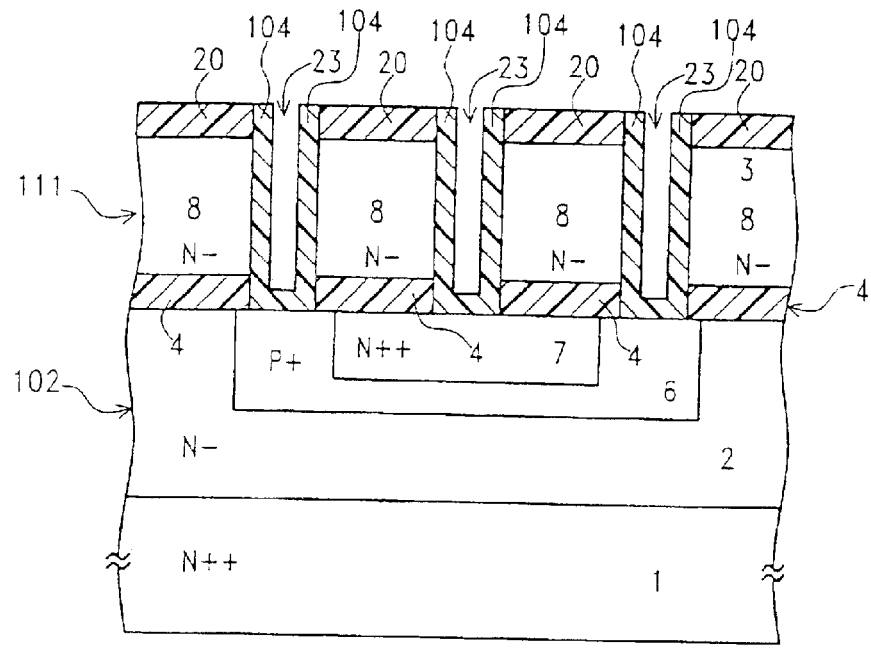
Figure 10:
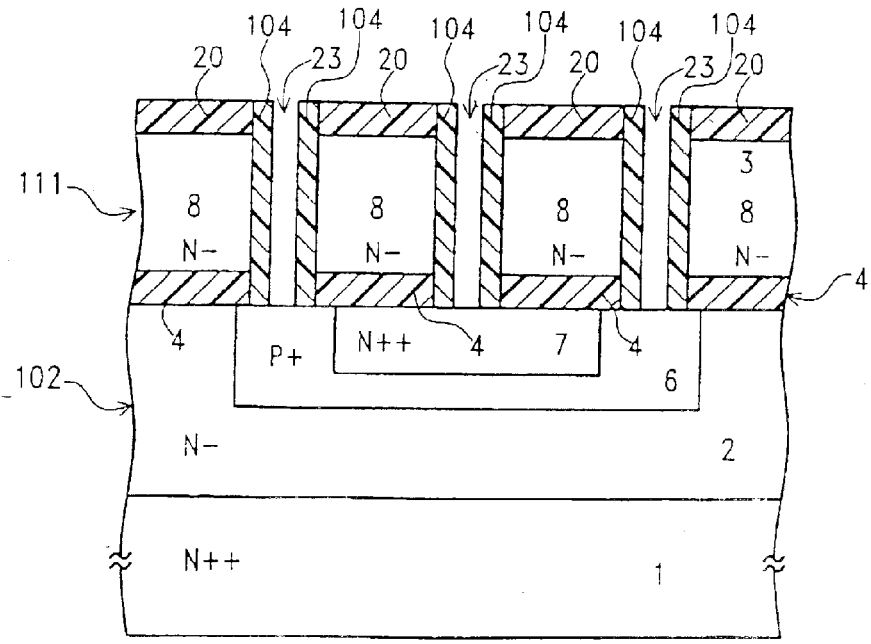
Figure 11:
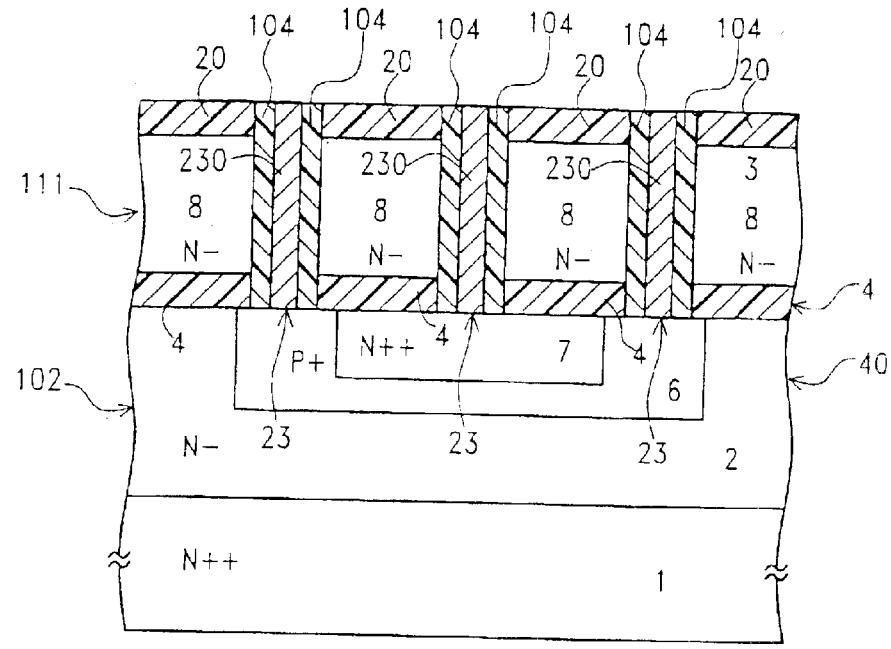

In FIG. 2 a typical silicon substrate 1 is shown with high concentration of an N type dopant, for example antimony or arsenic. A silicon layer 2 with low concentration of N type dopant is epitaxially grown on this substrate, as shown in FIG. 3. It is also possible to epitaxially grow two or more N type silicon layers with different dopant concentrations so that the power device can support prescribed voltage values. The silicon wafer 10 composed by the silicon layers 1 and 2 is oxidized obtaining a silicon wafer 11, as shown in FIG. 4. At the same time a second silicon wafer 12 constituted by a silicon substrate 3 with a low concentration of N type dopant is oxidized. The two oxidized silicon wafers 11 and 12 are soldered together with a thermal process, ("Silicon Direct Bonding"), in order to obtain a single wafer 13, as shown in FIG. 5. At this time the silicon substrate 3 is thinned by a means of a mechanical and chemical process, obtaining a silicon layer with a thickness of few microns or micron fractions. The two silicon oxide layers 41 and 42, once soldered together, constitute a single buried silicon oxide layer 4 which separates a first semiconductor layer 111, composed by the silicon layer 3, from the second semiconductor layer 102, composed by the layers 1 and 2. Then, as shown in FIG. 6, a new oxidation of the wafer 13 is realized to form an oxide layer 43 on the free surface of the layer 111, a photolithography technology is used, using a mask of a resist 5 constituted, for example, by photosensitive resin such as polyamide, to selectively remove the oxide 43, and to define an opening 44 therein. Then the wafer 13 is exposed to a successive implant of P type dopant ions, typically boron, in order to realize in the layer 2, in the layer 102, a silicon region 6 with a P type dopant. The dopant is implanted at very high energy, from 2 MeV to 5 MeV, so that the most of the implanted ions stop in the region 6 of the silicon layer 2. The region 6 will become the base of the power transistor 100 that it is to be realized. Similarly, in a successive step, a second oxidization and a second photolithography on the first silicon layer 111 are executed to define, in correspondence of the region 6, a narrower opening on the surface of the layer 111. A successive implant of N type dopant ions is executed, typically phosphorus, in the region 6, with high concentration of N type dopant, as shown in FIG. 7. The resist used in the photolithographic technology has a thickness and a composition such as to prevent the implanted ions from extending in the silicon zones under the resist. The region 7 will become the emitter of the power transistor 100 which is to be realized. On the surface of the layer 3 an oxide layer 20 is formed (FIG. 7). Then, as shown in FIG. 8, a further photolithography is executed in the first silicon layer 111, in order to define few zones on the surface of the layer 111. The superficial silicon oxide 20, the silicon layer 111 and the silicon oxide layer 4 are etched, to arrive to the silicon zones underneath the same oxide layer, in order to form vertical excavations 23, called "trenches". Then, as shown in FIG. 9, the trench walls 23 are covered by one or more dielectric layers 104, for example thermal oxide, deposited oxide, silicon nitride. The insulating dielectric layers placed in the bottom of the trenches 23 are removed, using already known technologies, as shown in FIG. 10. The trenches 23 are filled up with conductive material 230, for example polysilicon or metal, as shown in FIG. 11. If polysilicon is used, it must be doped differently, that is by P type or N type dopant, if the same polysilicon is in contact with P type or N type respectively doped zones. The doping of the polysilicon is executed by typical methods, for example by implanting dopant ions and then making them diffuse into the polysilicon. The dopant diffusivity in the polysilicon is higher than in silicon. This allows to make uniform the dopant concentration in the trenches 23. The polysilicon can be doped by boron dopant by a same boron deposition over the first layer 111, but, in such case, the polysilicon of the trenches 23 superimposed on the N type silicon regions, must be doped by high N type dopant concentration, for example phosphorus, using a photolithography in order to define the superficial zones over the trenches 23, and using a successive implant of N type dopant ions. Also a planarization of the free surface of the oxide layer 20 with the free superficial elements of the dielectric layer 104 and of the conductive material 230 are executed by a chemical etching process or mechanical process. Then the active and passive components of low or medium power of the control circuits are formed in the regions 8 by known VLSI technologies. In FIG. 1a the zones of contact among the component's active regions and the metal electrodes are indicated, after a phototechnology in order to define the contact zones and successive metal deposition. The suitable metals are deposited over the wafer's back by standard technologies.

The manufacturing process of the power integrated circuit with vertical current flow according to invention lends itself to different embodiments.

Figure 12:
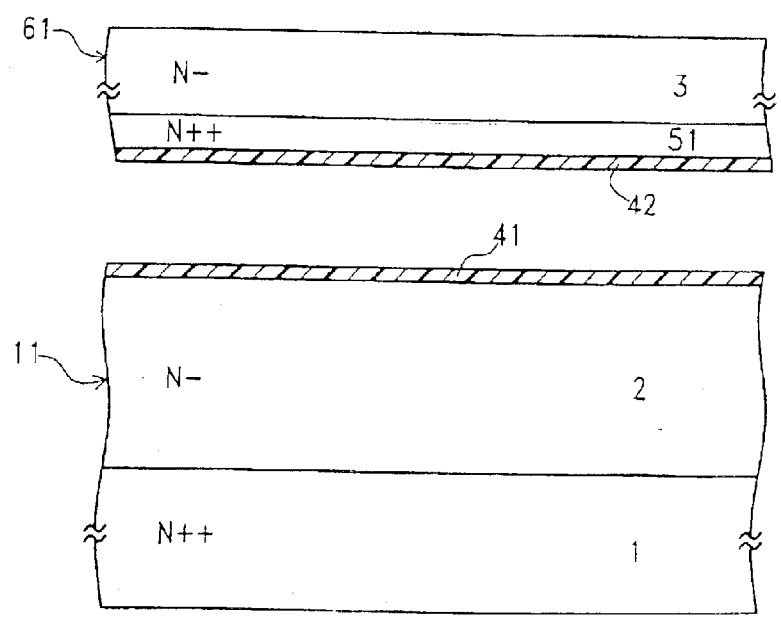
FIG. 12 shows, in a view similar to that of FIG. 4, a variant of the manufacturing process according to a first embodiment of the present invention.

A variant of the manufacturing process before described, provides, as shown in FIG. 12, for the use of a different type of silicon wafer 61, which in comparison with the silicon wafer 12 of FIG. 4, presents a silicon layer 51 with high N dopant concentration connected to the layer 3. Such layer 51 is formed before of the oxidation of the wafer 61 by an implant and successive diffusion of N type dopant ions, for example antimony or arsenic. The layer 51, that together with layer 3 form the first silicon layer 111, is useful in order to realize vertical NPN transistors of low voltage, for example the vertical NPN transistor 30 in FIG. 1a, because the layer 51 constitutes the collector region of these transistors.

The buried insulating material layer 4 of the power integrated circuit according to invention, can be constituted not only by a single silicon oxide layer but by a succession of dielectric layers, for example thermal oxide and deposited oxide, or thermal oxide and silicon nitride.

Figure 13:
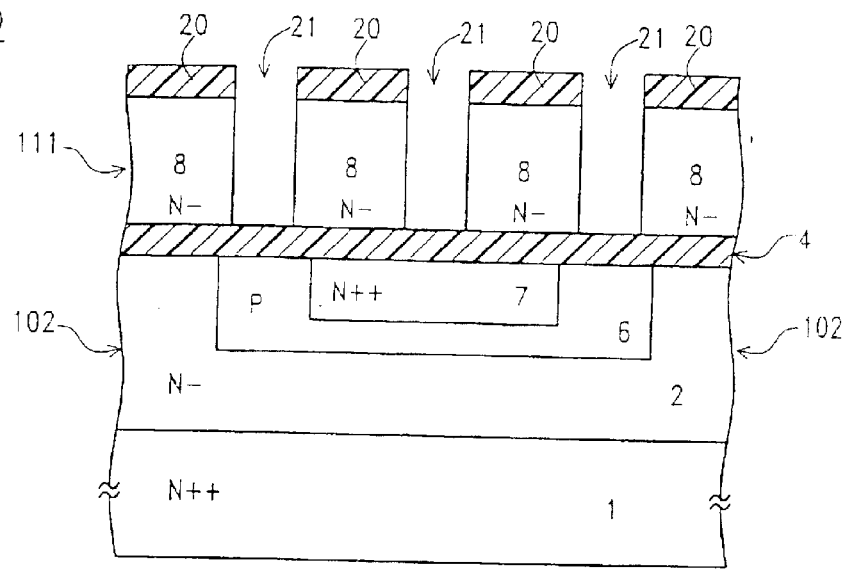
FIGS. 13, 14 are cross-sectional views illustrating a manufacturing process according to a second embodiment of the present invention.
Figure 14:
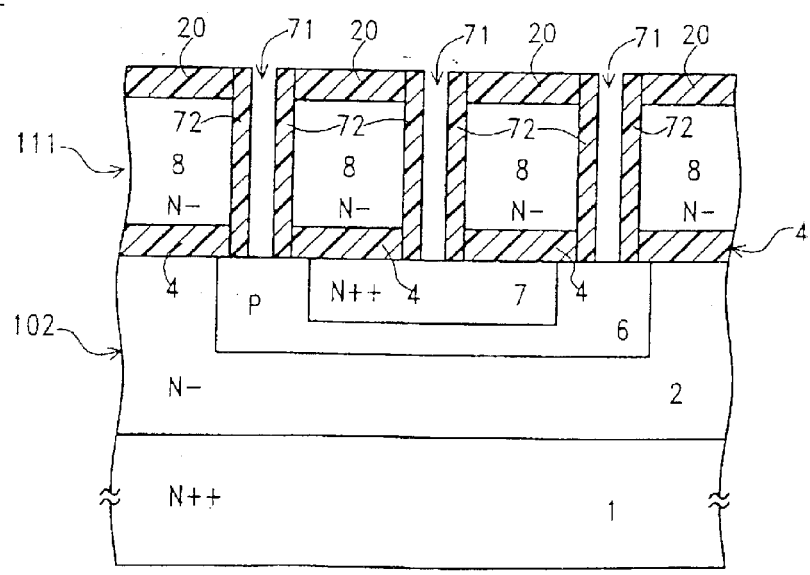

A second embodiment of the manufacturing process of the device, shown in FIGS. 13 and 14, provides for an alternative for the using of single etching for the trenches 23 formation, a etching in two successive steps. At a first time excavations 70 are formed only in the first silicon layer 111, made up by a silicon layer with low dopant concentration, and the walls and the bottom of excavation 70 are covered by deposited oxide 72. At a second time, by a photolithography which defines superficial zones in the excavations, narrow but deeper trenches 71 are formed by an etching of the deposited oxide and buried oxide 4, and the trenches 71 are filled up with a conductive material. It is not necessary to cover the trenches 71 walls by a dielectric, as described in FIG. 9, for the presence of oxide along the excavations, and it is not necessary to provide a process step in order to remove the oxide from the excavations' bottom, as instead shown in FIG. 10, because this was previously obtained contiguously with the etching of the silicon oxide 72.

Figure 15:
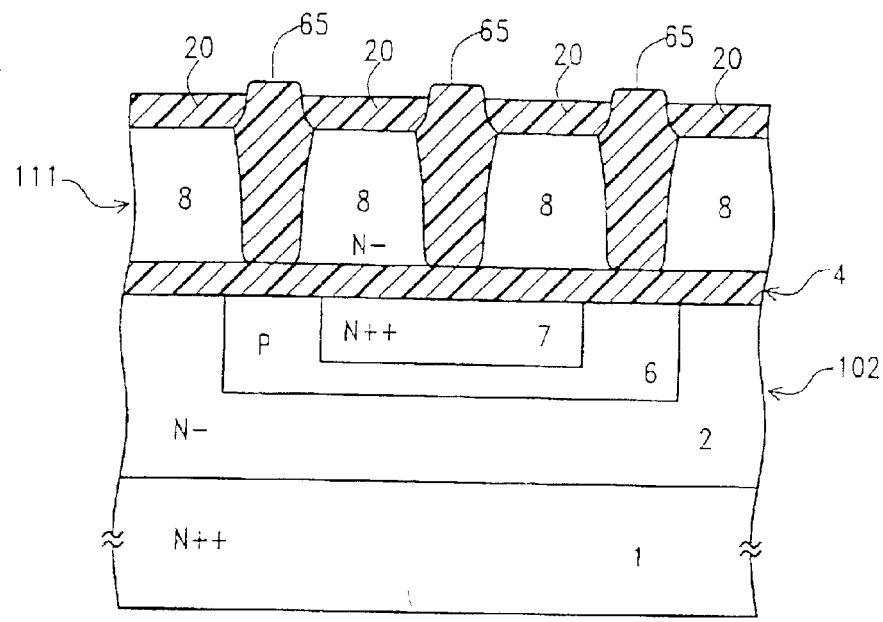
FIGS. 15, 16 are cross-sectional views illustrating a manufacturing process according to a third embodiment of the present invention.
Figure 16:
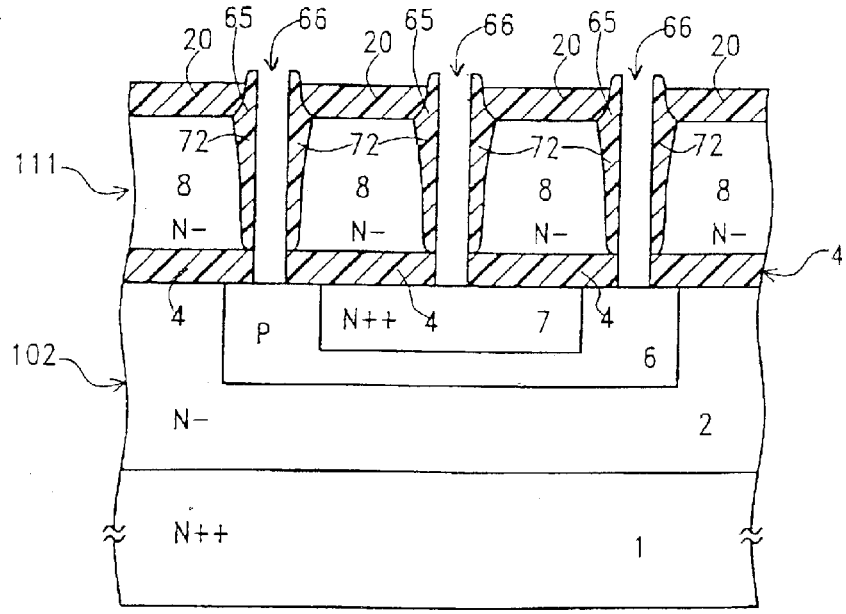

A third embodiment of the manufacturing process of the integrated circuit according to the invention, shown in FIGS. 15, 16, provides for an alternative solution to the use of trenches. In the zones where the excavations must be made to contact the active regions of the power component 100, rather than making excavations (trenches) directly in the first silicon layer 111, formed by a silicon layer with low dopant concentration (FIG. 8), and also covering the said excavations' walls by insulating material (FIG. 9), a selective and local oxidation (LOCOS) of the whole thickness of the silicon layer 111 can be executed, in order to obtain, at the surface, thin oxide zones, and thick oxide zones 65 which extend to the buried oxide layer 4. Inside each zone of thick oxide 65 an excavation 66 is defined by a photolithography to define superficial zones which have a width smaller than the width of the thick oxide zones 65, and successively etching the thick oxide 65. The excavations so done in the thick oxide zones 65, are lastly filled up with conductive material, for example doped polysilicon. Since the excavations 66 are made in the thick oxide zones 65, their walls are automatically constituted by insulating material, so covering the excavations' walls by a dielectric is not more necessary, as instead described in FIG. 9 in the case of the excavations formed directly in the silicon layer 111. Also providing a step to remove the oxide from excavations' bottom is not necessary, as shown in FIG. 10, because this was previously obtained simultaneously with the etching of the thick oxide 65.

Figure 17:
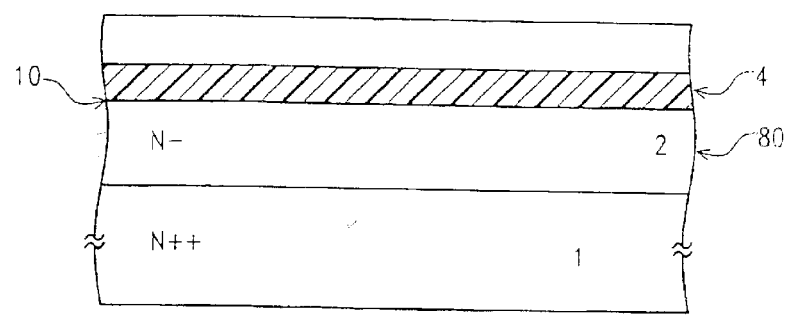
FIG. 17 is a cross-sectional view illustrating a manufacturing process according to a fourth embodiment of the present invention.

A fourth embodiment of the manufacturing process of the integrated circuit according to the invention, shown in FIG. 17, provides for a different way of formation of the buried oxide layer 4. An oxygen implant is executed in the substrate 2 of the wafer 10 of FIG. 3, in order to obtain a silicon wafer 80. Then a thermal process is executed on all wafer 80 to make the implanted oxygen react with the silicon in order to form the buried oxide layer 4 (Separation by IMplanted OXygen). Then the implant of the base region and the emitter region is performed, as described in FIGS. 6 and 7, and the process goes on as previously described.

A different process sequence in order to form the power integrated circuit described in FIGS. 1–12, is required if the conductive material used to fill up the trench is metal rather than polysilicon. In fact, because the metal can be deposited only in the final step of the manufacturing process of the device, it is necessary to realize at the first time low and medium voltage components, and successively, to form trenches 23. After the trenches' walls have been covered by dielectric and the dielectric have been removed from the bottom, the trenches 23 can be filled up with metal in order to contact the active regions of the power component 100.

Figure 18:
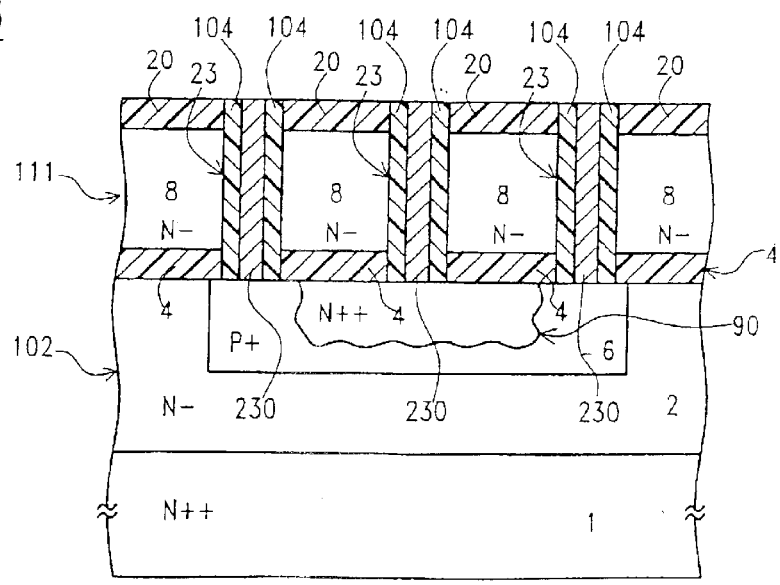
FIG. 18 is a cross-sectional view illustrating a manufacturing process according to a fifth embodiment of the present invention.

A fifth embodiment of the manufacturing process of the integrated circuit, shown in FIG. 18, provides for a different way to realize the device's region 6, which represents the emitter of the power component 100. Rather than executing the phosphorus implant by very high energy, after the trenches 23 have been filled up with polysilicon successively doped by phosphorus, that must constitute the contact with the emitter of the power component 100, a diffusion process is done. A few of the dopants contained in the polysilicon inside the trenches, diffuse in the silicon zone underlying such trenches and form a "spot" emitter 90.

The present invention can be applied equally to integrated circuits with more metallization layers, for example to contact several components of the device two metallization levels can be used.

It is noted that in all the previous embodiments the semiconductor layer 111 can be composed not only by a single layer with low dopant concentration, as shown in the respective figures, but by two superimposed layers with different dopant concentration, one silicon layer with high dopant concentration in contact with the insulating material buried layer 4, and one silicon layer with low dopant concentration.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Process for the manufacturing of a integrated circuit comprising a power component with vertical current flow, comprising the formation of a first semiconductor layer, a second semiconductor layer and an insulating material buried layer in said first and second semiconductor layer, the process comprising the steps of:

forming in said second semiconductor layer said power component's active regions;

forming in said first semiconductor layer and in said insulating material buried layer excavations which extend from a free surface of the first semiconductor layer to the second semiconductor layer, which have lateral walls of insulating material and are filled up with conductive material to electrically contact said active regions of the power component from the free surface of the first semiconductor layer; and forming low and/or medium voltage components in said first semiconductor layer.

2. Process according to claim 1, wherein said insulating material buried layer is an oxide layer formed by an oxygen implant and a successive thermal process in order to make the implanted oxygen react with the semiconductor.

3. Process according to claim 2, further comprising the step of providing a selective and local oxidation of the whole thickness of the first semiconductor layer, in order to obtain thick oxide zones which extend to the oxide buried layer, etching and selectively removing the thick oxide and the underlying buried oxide layer in order to define excavations inside each of said thick oxide zones.

4. Process according to claim 2, wherein said excavations are formed by making first excavations in the first semiconductor layer, covering said first excavations by deposited oxide, and etching and selectively removing the deposited oxide in the first excavations, and the underlying buried oxide layer.

5. Process according to claim 2, wherein said excavations are formed by etching and selective removing said first semiconductor layer and said insulating material buried layer to the second semiconductor layer in correspondence of said active regions of the power component.

6. Process according to claim 5, further comprising the step of covering the lateral walls of said excavations by a dielectric layer.

7. Process according to claim 6, further comprising the step of covering the lateral walls of said excavations by a dielectric layer.

8. Process according to claim 5, wherein said excavations are filled up with deposited metal.

9. Process according to claim 5, wherein said excavations are filled up by polysilicon doped of the same dopant type used in the silicon regions which said polysilicon contacts.

10. Process according to claim 9, further comprising providing, for the formation of said active regions of the power component, a selective implant at high energy of dopants from the free surface of the first semiconductor layer in order to form a first of said active regions, a diffusion of the doping ions contained in the polysilicon which fills up the excavations in the underlying silicon zone in order to form a second of said active regions, said second active region forming a "spot" active region.

11. Process according to claim 9, wherein said active regions of the power component are formed by selective implanting at high energy of dopants from the free surface of the first semiconductor layer.

12. Process according to claim 11, wherein said excavations, with lateral insulating material walls, in combination with said insulating material buried layer, define in the first semiconductor layer semiconductor regions dielectrically insulated from each other and from the second semiconductor layer, that are adapted to contain the low and/or medium voltage components.

13. Process according to claim 1, further comprising the step of providing, starting from said first and second semiconductor layer separated from each other, the formation of insulating material first layer and second layer on two respective surfaces of said first and second semiconductor layer, and thermal soldering of said insulating material first and second layer in order to form said insulating material buried layer.

14. Process according to claim 13, wherein said insulating material buried layer is formed by a dielectric multi-layer.

15. Process according to claim 14, wherein said first layer is constituted by a layer with low dopant concentration.

16. Process according to claim 14, wherein said first layer comprises two superimposed silicon layers, an upper silicon layer with low dopant concentration and a lower silicon layer with high dopant concentration, to better contact the insulating material buried layer.

17. Process according to claim 13, wherein said insulating material buried layer is formed by a silicon oxide layer originating from the overlapping of the silicon oxide layers.

18. Process according to claim 17, wherein said first layer comprises two superimposed silicon layers, an upper silicon layer with low dopant concentration and a lower silicon layer with high dopant concentration, to better contact the insulating material buried layer.

19. Process according to claim 18, wherein said excavations are formed by etching and selective removing said first semiconductor layer and said insulating material buried layer to the second semiconductor layer in correspondence of said active regions of the power component.

20. Process according to claim 17, wherein said first layer is constituted by a layer with low dopant concentration.

21. Process according to claim 20, wherein said excavations are formed by etching and selective removing said first semiconductor layer and said insulating material buried layer to the second semiconductor layer in correspondence of said active regions of the power component.

22. Process according to claim 21, further comprising the step of covering the lateral walls of said excavations by a dielectric layer.

* * * * *